(12) United States Patent
Satake (10) Patent No.: US 11,728,145 B2
(45) Date of Patent: Aug. 15, 2023

(54) STAGE AND SUBSTRATE PROCESSING APPARATUS

(71) Applicant: TOKYO ELECTRON LIMITED, Tokyo (JP)

(72) Inventor: Daisuke Satake, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 15 days.

(21) Appl. No.: 17/129,868

(22) Filed: Dec. 21, 2020

(65) Prior Publication Data

US 2021/0202219 A1    Jul. 1, 2021

(30) Foreign Application Priority Data

Dec. 27, 2019 (JP) .................................. 2019-239315

(51) Int. Cl.
  *H01J 37/32* (2006.01)
  *H01L 21/67* (2006.01)
  (Continued)

(52) U.S. Cl.
  CPC .... *H01J 37/32724* (2013.01); *H01J 37/3244* (2013.01); *H01J 37/32449* (2013.01);
  (Continued)

(58) Field of Classification Search
  None
  See application file for complete search history.

(56) References Cited

U.S. PATENT DOCUMENTS 5,382,311 A  *  1/1995  Ishikawa ............. C23C 16/4586
                                                      118/728
5,720,818 A  *  2/1998  Donde ................ C23C 16/4586
                                                      118/728
(Continued)

FOREIGN PATENT DOCUMENTS

JP         11329977 A  *  11/1999 ............. H01L 21/00
JP       2016-28448 A      2/2016
JP        6520160 B2  *   5/2019

OTHER PUBLICATIONS

English Machine translation of Fuku et al. (JP-11329977-A) retrieved from Espacenet on Jun. 14, 2022 (Year: 2022).*

(Continued)

*Primary Examiner* — Ram N Kackar
*Assistant Examiner* — Laureen Chan
(74) *Attorney, Agent, or Firm* — Nath, Goldberg & Meyer; Jerald L. Meyer; Tanya E. Harkins (57) ABSTRACT

A stage includes: a pin insertion passage penetrating the stage on which a substrate is mounted, and configured to allow a lifter pin to be inserted into and penetrate the pin insertion passage, a heat transfer gas passage penetrating the stage, and configured to introduce a heat transfer gas onto a mounting surface of the stage; a common gas passage in communication with the pin insertion passage and the heat transfer gas passage, and configured to allow the heat transfer gas to flow through the common gas passage; and a first member disposed to face the common gas passage at a location at which the pin insertion passage and the common gas passage intersect each other, and configured to adjust a flow rate of the heat transfer gas introduced onto the mounting surface of the stage from the pin insertion passage.

20 Claims, 8 Drawing Sheets

(51) Int. Cl.
*H01L 21/687* (2006.01)
*H01L 21/683* (2006.01)

(52) U.S. Cl.
CPC .. *H01J 37/32715* (2013.01); *H01L 21/67103* (2013.01); *H01L 21/6833* (2013.01); *H01L 21/68742* (2013.01)

(56) References Cited

U.S. PATENT DOCUMENTS

| | | | | |
|---|---|---|---|---|
| 2009/0014323 | A1* | 1/2009 | Yendler | H01L 21/67069 |
| | | | | 204/298.33 |
| 2016/0064189 | A1* | 3/2016 | Tandou | H01J 37/32192 |
| | | | | 156/345.33 |
| 2019/0080955 | A1* | 3/2019 | Lee | G03F 7/70691 |
| 2019/0157130 | A1* | 5/2019 | Lee | H01L 21/67109 |

OTHER PUBLICATIONS

English Machine translation of (JP-6520160-B2) retrieved from Espacenet on Jun. 14, 2022 (Year: 2022).*

* cited by examiner

B-B cross section

FIG. 3C

B-B cross section

STAGE AND SUBSTRATE PROCESSING APPARATUS

CROSS-REFERENCE TO RELATED APPLICATION

This application is based upon and claims the benefit of priority from Japanese Patent Application No. 2019-239315, filed on Dec. 27, 2019, the entire contents of which are incorporated herein by reference.

TECHNICAL FIELD

The present disclosure relates to a stage, a substrate processing apparatus, and a heat transfer gas supply method.

BACKGROUND

Patent Document 1 discloses a stage having an electrostatic chuck, a base, and a cylindrical sleeve. A first through-hole is formed in the electrostatic chuck. The base is bonded to a rear surface of the electrostatic chuck by a first bonding layer, and a second through-hole in communication with the first through-hole is formed in the base.

PRIOR ART DOCUMENT

Patent Document

Patent Document 1: Japanese laid-open publication No. 2016-28448

SUMMARY

An aspect of the present disclosure provides a stage including: a pin insertion passage penetrating the stage on which a substrate is mounted, and configured to allow a lifter pin to be inserted into and penetrate the pin insertion passage; a heat transfer gas passage penetrating the stage, and configured to introduce a heat transfer gas onto a mounting surface of the stage: a common gas passage in communication with the pin insertion passage and the heat transfer gas passage, and configured to allow the heat transfer gas to flow through the common gas passage; and a first member disposed to face the common gas passage at a location at which the pin insertion passage and the common gas passage intersect each other, and configured to adjust a flow rate of the heat transfer gas introduced onto the mounting surface of the stage from the pin insertion passage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An exemplary embodiment provides a stage configured to mount a substrate thereon. The stage includes: a pin insertion passage penetrating the stage on which the substrate is mounted, and configured to allow a lifter pin to be inserted into and penetrate the pin insertion passage; a heat transfer gas passage penetrating the stage, and configured to introduce a heat transfer gas onto a mounting surface of the stage; a common gas passage in communication with the pin insertion passage and the heat transfer gas passage, and configured to allow the heat transfer gas to flow therethrough; and a first member disposed to face the common gas passage at a location at which the pin insertion passage and the common gas passage intersect each other, and configured to adjust a flow rate of the heat transfer gas introduced onto the mounting surface of the stage from the pin insertion passage.

Modes for carrying out the present disclosure will now be described with reference to the drawings. Further, in the present disclosure and drawings, substantially like components are denoted by like reference numerals and a repeated description thereof will be omitted.

[Substrate Processing Apparatus]

Figure 1:
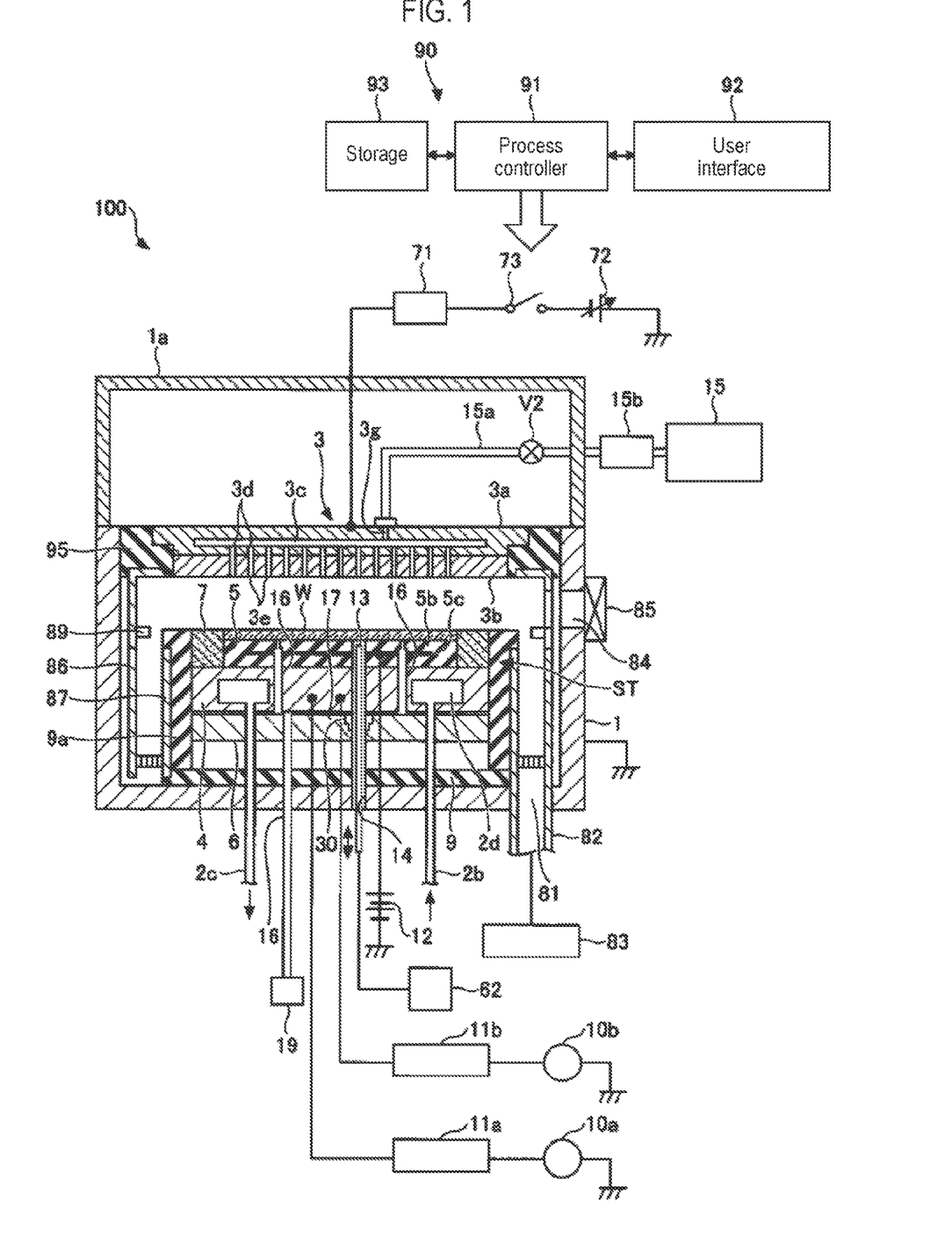
FIG. 1 is a cross-sectional view illustrating a substrate processing apparatus according to an embodiment.

First, a substrate processing apparatus 100 according to an embodiment will be described with reference to FIG. 1. FIG. 1 is a view illustrating an example of the substrate processing apparatus 100 according to an embodiment. The substrate processing apparatus 100 provides an example of some plasma generation systems used for forming plasma from a processing gas.

FIG. 1 is a schematic cross-sectional view illustrating a configuration of the substrate processing apparatus 100 according to the present embodiment. The substrate processing apparatus 100 has a chamber 1 which is airtightly configured and electrically grounded. The chamber 1 has a cylindrical shape and is formed of, for example, aluminum. A stage ST on which a substrate W is mounted is provided in the chamber 1. The stage ST has a base 6, a lower electrode 4, and an electrostatic chuck 5. The base 6 and the lower electrode 4 are formed of a conductive metal such as aluminum. The base 6 supports the lower electrode 4 and the stage ST. A wafer is an example of the substrate W.

An edge ring 7 formed of, for example, silicon is provided around the substrate W. The edge ring 7 will also be referred to as a focus ring. A cylindrical inner wall 9a formed of, for example, quartz is provided around the edge ring 7, the lower electrode 4, and the base 6. The stage ST is disposed at a bottom portion of the chamber 1 via the inner wall 9*a* and a support 9 formed of, for example, quartz.

An electrode 5*c* in the electrostatic chuck 5 is sandwiched between dielectrics 5*b* and connected to a power source 12. When a voltage is applied from the power source 12 to the electrode 5*c*, the substrate W is electrostatically adsorbed to the electrostatic chuck 5 by a Coulomb force.

The stage ST has a flow passage 2*d* inside the stage ST. A heat medium such as water supplied from a chiller unit circulates through an inlet pipe 2*b*, the flow passage 2*d*, and an outlet pipe 2*c*. A heat transfer gas passage 16 and a common gas passage 17 are formed inside the stage ST. A heat transfer gas source 19 supplies a heat transfer gas to the heat transfer gas passage 16 to introduce the heat transfer gas into a space between a lower surface of the substrate W and a mounting surface of the electrostatic chuck 5, and allows the heat transfer gas to flow through the common gas passage 17. The heat transfer gas is supplied from the common gas passage 17 to a pin insertion passage 14. At this time, a flow rate of the heat transfer gas supplied to the pin insertion passage 14 is adjusted by a first member 30. Thus, the heat transfer gas having a desired pressure is introduced into the space between the lower surface of the substrate W and the mounting surface of the electrostatic chuck 5. The heat transfer gas introduced as described above may be an inert gas such as a helium (He) gas, an argon (Ar) gas, or the like. In the embodiment, introducing a helium gas will be described by way of example. A gas used in a process, as well as the heat transfer gas, may be introduced as described above. Examples of the gas used in the process may include an oxygen gas ($O_2$) and a nitrogen gas ($N_2$).

A plurality of lifter pins, for example, three lifter pins 13 (only one lifter pin 13 is illustrated in FIG. 1), penetrates the stage ST. A plurality of pin insertion passages 14 (only one pin insertion passage 14 is illustrated in FIG. 1) is provided in the stage ST. The lifter pins 13, which are inserted into and penetrate the pin insertion passages 14, are connected to an elevating mechanism 62 so as to be vertically moved by driving of the elevating mechanism 62.

A first RF power source 10*a* is connected to the base 6 via a first matching device 11*a*, and a second RF power source 10*b* is connected to the base 6 via a second matching device 11*b*. The first RF power source 10*a* applies high-frequency power for plasma generation having a predetermined frequency to the lower electrode 4. The second RF power source 10*b* applies high-frequency power for bias voltage for drawing ions, which has a frequency lower than the frequency of the high-frequency power for plasma generation, to the lower electrode 4. However, in some cases, the high-frequency power supplied from the second RF power source 10*b* may be used for plasma generation. An upper electrode 3 facing the stage ST is provided above the stage ST. The upper electrode 3 and the stage ST function as a pair of electrodes (the upper electrode and the lower electrode). The upper electrode 3 also functions as a gas shower head.

The upper electrode 3 has an electrode plate 3*b* and a ceiling plate 3*a*. An insulating annular member 95 supporting the upper electrode 3 is provided around the upper electrode 3, and an upper opening of the chamber 1 is closed by the upper electrode 3 and the annular member 95. The ceiling plate 3*a* is formed of a conductive material, for example, aluminum having an anodized surface, and detachably supports the electrode plate 3*b* therebelow.

A gas diffusion chamber 3*c* and a gas inlet 3*g* for introducing a processing gas into the gas diffusion chamber 3*c* are formed in the ceiling plate 3*a*. A gas pipe 15*a* is connected to the gas inlet 3*g*. A gas supplier 15, a mass flow controller (MFC) 15*b*, and an opening and closing valve V2 are sequentially connected to the gas pipe 15*a* so that the processing gas is supplied from the gas supplier 15 into the ceiling plate 3*a* via the gas pipe 15*a*. The opening and closing valve V2 and the mass flow controller (MFC) 15*b* control on and off and a flow rate of the gas.

A plurality of gas passage holes 3*d* is formed below the gas diffusion chamber 3*c* toward the interior of the chamber 1, and penetrates the electrode plate 3*b*. Leading ends of the gas passage holes 3*d* are formed as gas introduction holes 3*e*. The processing gas is supplied from the gas introduction holes 3*e* into the chamber 1 in a shower shape via the gas diffusion chamber 3*c* and the gas passage holes 3*d*.

A variable DC power source 72 is connected to the upper electrode 3 via a low-pass filter (LPF) 71, and supply of a DC voltage output from the variable DC power source 72 is turned on and off by a switch 73. The DC voltage from the variable DC power source 72 and the turning-on and turning-off of the switch 73 are controlled by a controller 90. When plasmarizing the processing gas by applying the high-frequency power from the first RF power source 10*a* and the second RF power source 10*b* to the stage ST, if necessary, the switch 73 is turned on by the controller 90 to apply a predetermined DC voltage to the upper electrode 3.

A cylindrical ground conductor 1*a* is provided so as to extend from a sidewall of the chamber 1 to a location higher than a height position of the upper electrode 3. The cylindrical ground conductor 1*a* has a ceiling wall at an upper portion thereof.

An exhaust port 81 is formed at a bottom portion of the chamber 1, and an exhaust device 83 is connected to the exhaust port 81 via an exhaust pipe 82. The exhaust device 83 has a vacuum pump, and depressurizes the interior of the chamber 1 to a predetermined vacuum degree by activating the vacuum pump. A loading and unloading port 84 for the substrate W is provided on the sidewall of the chamber 1. The loading and unloading port 84 can be opened and closed by a gate valve 85.

A deposit shield 86 is provided inside a side portion of the chamber 1 along an inner wall surface of the chamber 1. In addition, a deposit shield 87 is detachably provided along the inner wall 9*a*. The deposit shields 86 and 87 prevent an etching byproduct (deposit) from adhering to the inner wall of the chamber 1 and the inner wall 9*a*. The deposit shield 86 is provided with a conductive member (GND block) 89, to which a potential with respect to the ground is controllably connected, at a height position substantially equal to a height position of the substrate W, thereby preventing abnormal discharge.

The substrate processing apparatus 100 is comprehensively controlled by the controller 90. The controller 90 is provided with a process controller 91 for controlling respective components of the substrate processing apparatus 100, a user interface 92, and a storage 93.

The user interface 92 includes a keyboard through which a process manager performs an input operation of a command to manage the substrate processing apparatus 100, a display for visually displaying the operating status of the substrate processing apparatus 100, and the like.

The storage 93 stores therein a control program (software) for causing the process controller 91 to execute various processes executed by the substrate processing apparatus 100, and recipes in which processing condition data and the like are stored. When necessary, a desired process is performed in the substrate processing apparatus 100 under the control of the process controller 91 by fetching an arbitrary recipe from the storage 93 according to an instruction from the user interface 92 and causing the process controller 91 to execute the recipe.

Further, the control program or the recipes such as the processing condition data may be stored in a non-transitory computer-readable storage medium, or may be used online, for example, by being transmitted from another device at any time via a dedicated line. The storage medium may include, for example, a hard disk, a CD, a flexible disc, a semiconductor memory, and the like.

[Stage]

Figure 2:
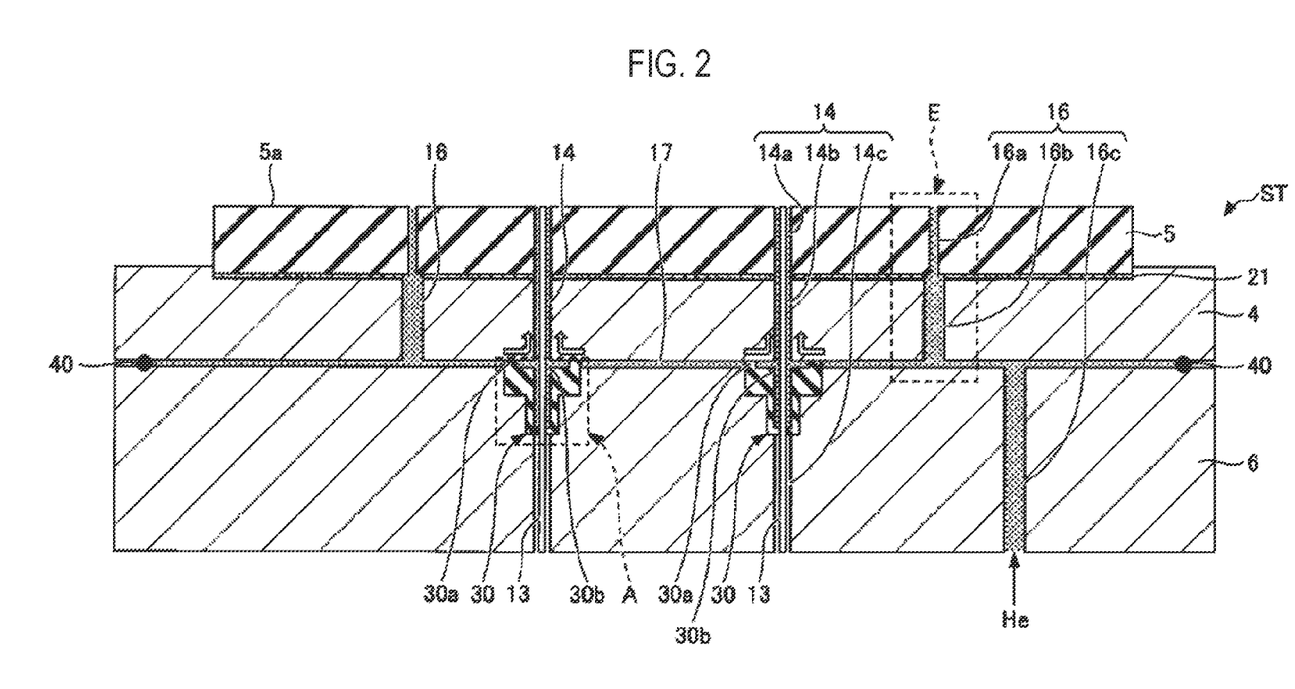
FIG. 2 is a cross-sectional view illustrating a stage according to an embodiment.

Next, the stage ST according to an embodiment will be described with reference to FIGS. 2 to 3C. FIG. 2 is a cross-sectional view illustrating the stage ST according to an embodiment. FIGS. 3A to 3C are enlarged views of the first member 30 provided in the stage ST according to the embodiment. As illustrated in FIG. 2, a bonding layer 21 for bonding the electrostatic chuck 5 and the lower electrode 4 with a bonding agent is provided between the electrostatic chuck 5 and the lower electrode 4.

The heat transfer gas passage 16, the pin insertion passages 14, and the common gas passage 17 are formed inside the stage ST. The heat transfer gas passage 16 has a through-hole 16a vertically penetrating the electrostatic chuck 5, a through-hole 16b vertically penetrating the lower electrode 4, and a through-hole 16c vertically penetrating the base 6.

The through-hole 16b is located below the through-hole 16a and vertically in communication with the through-hole 16a. The diameter of the through-hole 16b is larger than the diameter of the through-hole 16a. The through-hole 16a is opened on the mounting surface of the electrostatic chuck 5. The through-hole 16b is in communication with the through-hole 16c via the common gas passage 17. However, the through-hole 16c may be arranged below the through-hole 16b so as to be vertically in communication with the through-hole 16b. The diameter of the through-hole 16c may be equal to or different from the diameter of the through-hole 16b.

Each of the pin insertion passage 14 has a through-hole 14a vertically penetrating the electrostatic chuck 5, a through-hole 14b vertically penetrating the lower electrode 4, and a through-hole 14c vertically penetrating the base 6 and in communication with a through-hole 30b of the first member 30.

The through-hole 14b is located below the through-hole 14a and vertically in communication with the through-hole 14a. The diameter of the through-hole 14b is equal to the diameter of the through-hole 14a. However, the diameter of the through-hole 14b may be different from the diameter of the through-hole 14a. The through-hole 14a is opened on the upper surface of the electrostatic chuck 5. The through-hole 30b is located below the through-hole 14b with the common gas passage 17 interposed therebetween, and vertically in communication with the through-hole 14b. The diameter of the through-hole 30b is equal to the diameter of the through-hole 14b. The through-hole 14c is located below the through-hole 30b and vertically in communication with the through-hole 30b. The diameter of the through-hole 14c is equal to the diameter of the through-hole 30b. However, the diameter of the through-hole 14c may be different from the diameter of the through-hole 14b.

The first member 30 is embedded in a recess opened on the upper surface of the base 6. The through-hole 14c is located below the through-hole 14b and vertically in communication with the through-hole 14b via the through-hole 30b of the first member 30. The diameter of the through-hole 14c is equal to the diameter of the through-hole 14b.

A helium gas output from the heat transfer gas source 19 is introduced onto the mounting surface 5a of the electrostatic chuck 5 from the through-hole 16a via the through-hole 16c and the common gas passage 17 and via the through-hole 16b. The common gas passage 17 is a space located between the lower electrode 4 and the base 6, and is configured to prevent the helium gas from leaking to a side of a processing space by an O-ring 40 provided in the vicinity of an end portion between the lower electrode 4 and the base 6. Further, the O-ring 40 has a function of partitioning the processing space, which is a vacuum space, from an atmospheric space.

The helium gas is allowed to flow into the pin insertion passage 14 via the common gas passage 17. Thus, the helium gas is introduced onto the mounting surface 5a of the electrostatic chuck 5 through a gap between the pin insertion passage 14 and the lifter pin 13 in the pin insertion passage 14.

A configuration of the first member 30 and the vicinity of the first member 30 will be further described with reference to FIGS. 3A to 3C. FIG. 3A is an enlarged cross-sectional view of the first member 30 and the vicinity of the first member 30 indicated by A in FIG. 2. FIG. 3B is an example of a B-B cross section in FIG. 3A, and is a view of the first member 30 as seen from above. FIG. 3C is another example of the B-B cross section in FIG. 3A, and is a view of the first member 30 as seen from above.

Figure 3A:
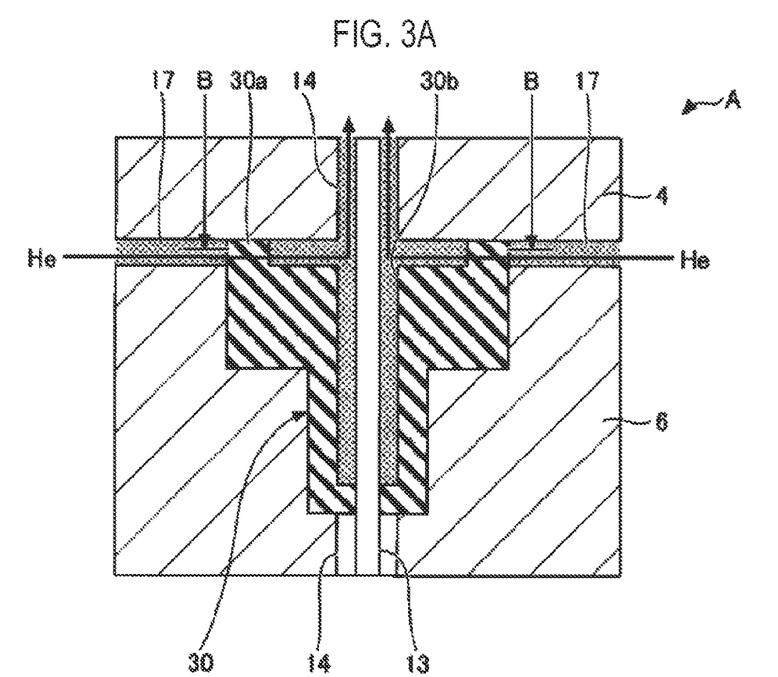
FIGS. 3A to 3C are enlarged views of a first member installed in the stage according to the embodiment.
Figure 3B:
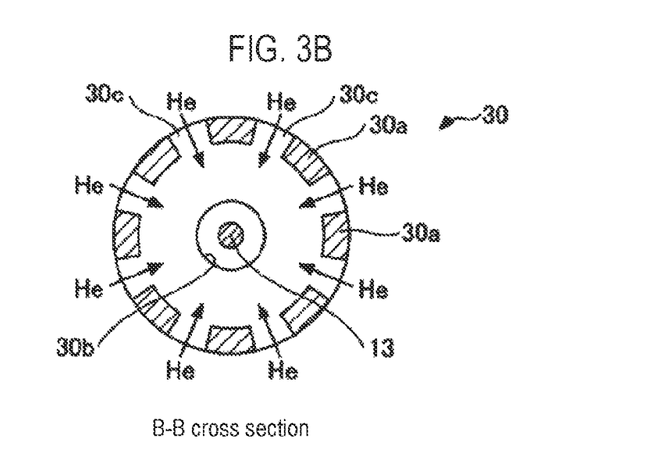

As illustrated in FIG. 3A, the first member 30 is embedded in the recess formed on the base 6 so that the upper surface thereof is flush with the upper surface of the base 6. Thus, the first member 30 is configured to face the common gas passage 17. The lifter pin 13 is inserted into the through-hole 30b that penetrates through the inside of the first member 30.

The first member 30 may be formed of an insulating material such as resin, sapphire, polytetrafluoroethylene (PTFE), or the like.

The first member 30 has a protrusion 30a on an outer peripheral portion of the upper surface thereof. The protrusion 30a is in contact with the lower surface of the lower electrode 4. As illustrated in FIGS. 3B and 3C, the protrusion 30a is circumferentially formed on the outer peripheral portion of the upper surface of the first member 30. A plurality of grooves 30c is formed in the protrusion 30a at equal intervals. The plurality of grooves 30c is radially formed. The plurality of grooves 30c adjusts a flow rate of the helium gas flowing from the common gas passage 17 to the pin insertion passage 14. Also, the protrusion 30a may be disposed on the entirety of the upper surface of the first member 30 from the inner side thereof toward the outer peripheral side thereof, as well as on the outer peripheral portion.

Accordingly, the helium gas is introduced into a space between the lower surface of the substrate W and the mounting surface 5a of the electrostatic chuck 5 from the heat transfer gas passage 16, and is also introduced into the space from the pin insertion passage 14 in communication with the common gas passage 17 while the flow rate of the helium gas is adjusted through the plurality of grooves 30c. The shape, number, and arrangement of the grooves 30c are not limited to the examples illustrated in FIGS. 3B and 3C. For example, the number of the grooves 30c may be one or more. Also, the plurality of grooves 30c may not be formed at equal intervals.

By changing the shape, width, and number of the grooves 30c of the first member 30, the conductance of the flow passage through which the helium gas flows is changed, which makes it possible to optimize the flow rate of the helium gas introduced onto the mounting surface 5a of the electrostatic chuck 5 from the pin insertion passage 14. For example, in FIG. 3B, eight grooves 30c are evenly disposed on the outer periphery of the upper surface of the first member 30. In this case, the helium gas flows from the common gas passage 17 into the first member 30 through the eight grooves 30c, flows through the pin insertion passage 14, and is introduced onto the mounting surface 5a of the electrostatic chuck 5. Also, the grooves 30c may be disposed on the entirety of the upper surface of the first member 30 from the inner side thereof toward the outer peripheral side thereof, as well as on the outer peripheral portion.

Figure 3C:
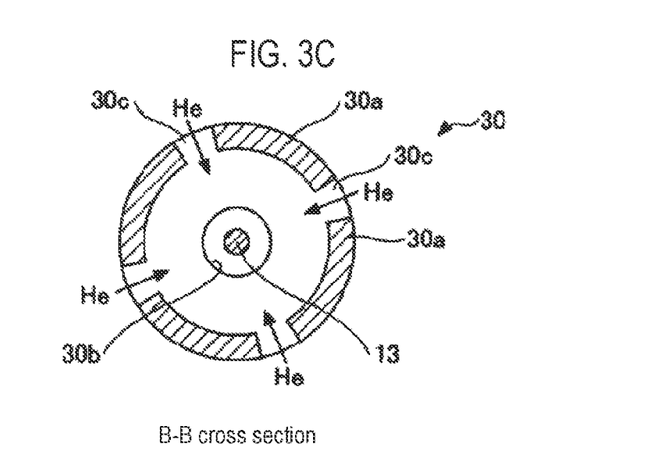

On the other hand, in FIG. 3C, four grooves 30c are evenly disposed on the outer periphery of the upper surface of the first member 30. In this case, the helium gas is introduced onto the mounting surface 5a of the electrostatic chuck 5 from the common gas passage 17 through the four grooves 30c. In a case where the shapes (widths) of the grooves 30c are the same as one another, when the first member 30 illustrated in FIG. 3B is used, it is possible to increase the conductance and to increase the flow rate of the helium gas introduced onto the mounting surface 5a. In contrast, when the first member 30 illustrated in FIG. 3C is used, it is possible to reduce the conductance and to reduce the flow rate of the helium gas introduced onto the mounting surface 5a. However, in addition to adjusting the number of the grooves 30c, the flow rate of the helium gas may be changed by adjusting the shape of the grooves 30c or by changing the thickness of the lifter pin 13.

[Effects]

Figure 4A:
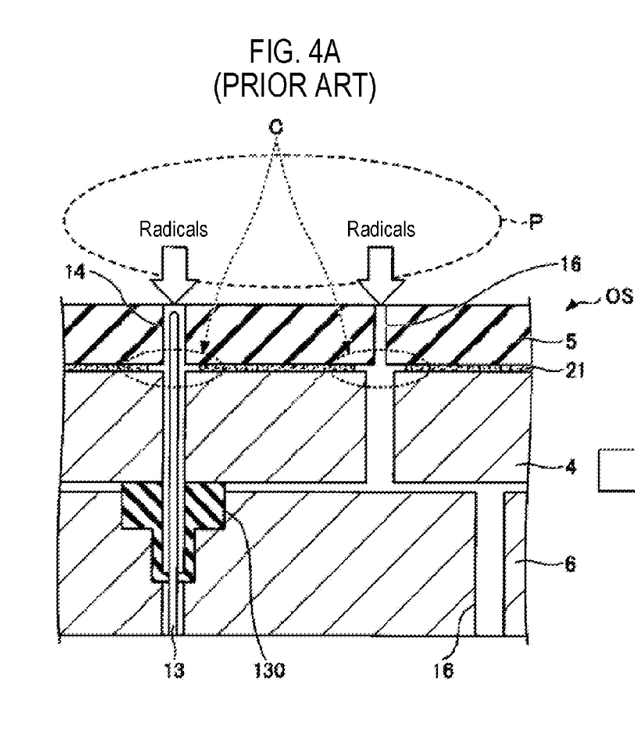
FIGS. 4A and 4B are views for explaining effects of the stage according to the embodiment in comparison with a conventional stage.
Figure 4B:
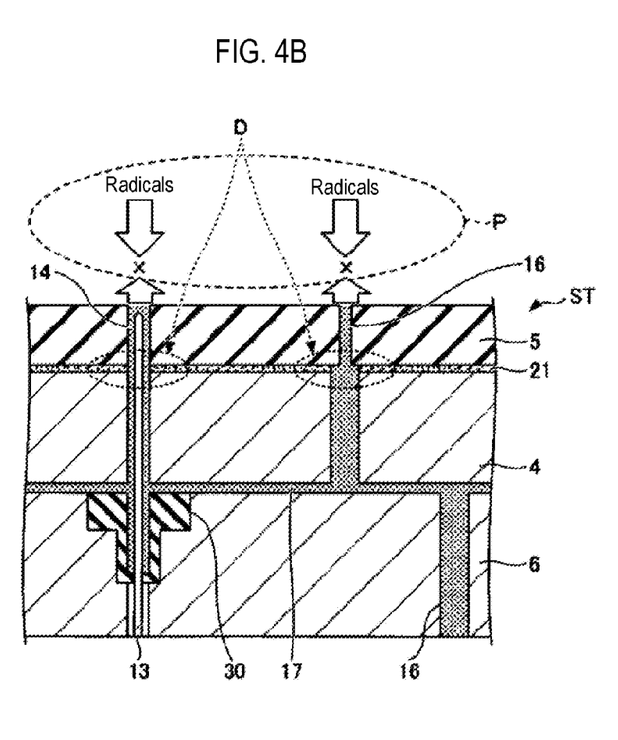

Effects of performing a wafer-less dry cleaning (WLDC) process in the substrate processing apparatus 100 including the stage ST described above will be described with reference to FIGS. 4A and 4B. FIG. 4B is a view for explaining effects of the stage ST according to the embodiment in comparison with a conventional stage OS illustrated in FIG. 4A. A member 130 illustrated in FIG. 4A does not have a function of adjusting the flow rate of the helium gas, as in the first member 30, when the lifter pin 13 moves up and down the pin insertion passage 14.

In the stage ST according to the embodiment illustrated in FIG. 4B, the helium gas is introduced onto the mounting surface 5a of the electrostatic chuck 5 from the heat transfer gas passage 16 and the pin insertion passage 14 during the substrate processing. Similarly, during the cleaning process, the helium gas is also introduced onto the mounting surface 5a of the electrostatic chuck 5 from the heat transfer gas passage 16 and the pin insertion passage 14.

In particular, a wafer-less dry cleaning process is performed without mounting the substrate W on the electrostatic chuck 5. Thus, the surface of the electrostatic chuck 5 is exposed to plasma P. In this case, in the conventional stage OS illustrated in FIG. 4A, radicals in the plasma P enter the pin insertion passage 14 and the heat transfer gas passage 16.

When the bonding layer 21 is exposed to the plasma P entering the inside of the pin insertion passage 14 and the heat transfer gas passage 16 as described above, the components constituting the bonding layer 21 are damaged. Consequently, portions of the bonding layer 21 indicated by C in FIG. 4A are consumed or deteriorate in bonding strength.

When the bonding layer 21 is consumed or deteriorates in bonding strength, it is difficult to control heat conduction to members bonded to the electrostatic chuck 5, the substrate W, the edge ring 7, and the lower electrode 4. As a result, it becomes difficult to perform uniform and accurate processing on the substrate W.

Therefore, the embodiment provides the stage ST capable of preventing deterioration of the bonding layer 21 used for bonding the electrostatic chuck 5, and the substrate processing apparatus 100 including such a stage ST.

That is, as illustrated in FIG. 4B, the helium gas is simultaneously introduced into the pin insertion passage 14 and the heat transfer gas passage 16 while the flow rate of the helium gas is adjusted by the first member 30. Consequently, portions of the bonding layer 21 indicated by D in FIG. 4B are not consumed or deteriorate in bonding strength.

With this configuration, it is possible to prevent the plasma P from entering the heat transfer gas passage 16 and the pin insertion passage 14 by supplying the helium gas not only to the heat transfer gas passage 16 but also to the pin insertion passage 14. Thus, it is possible to prevent the consumption of the bonding layer 21. This is particularly effective when no substrate W is mounted during the cleaning process.

[Modification]

Figure 5:
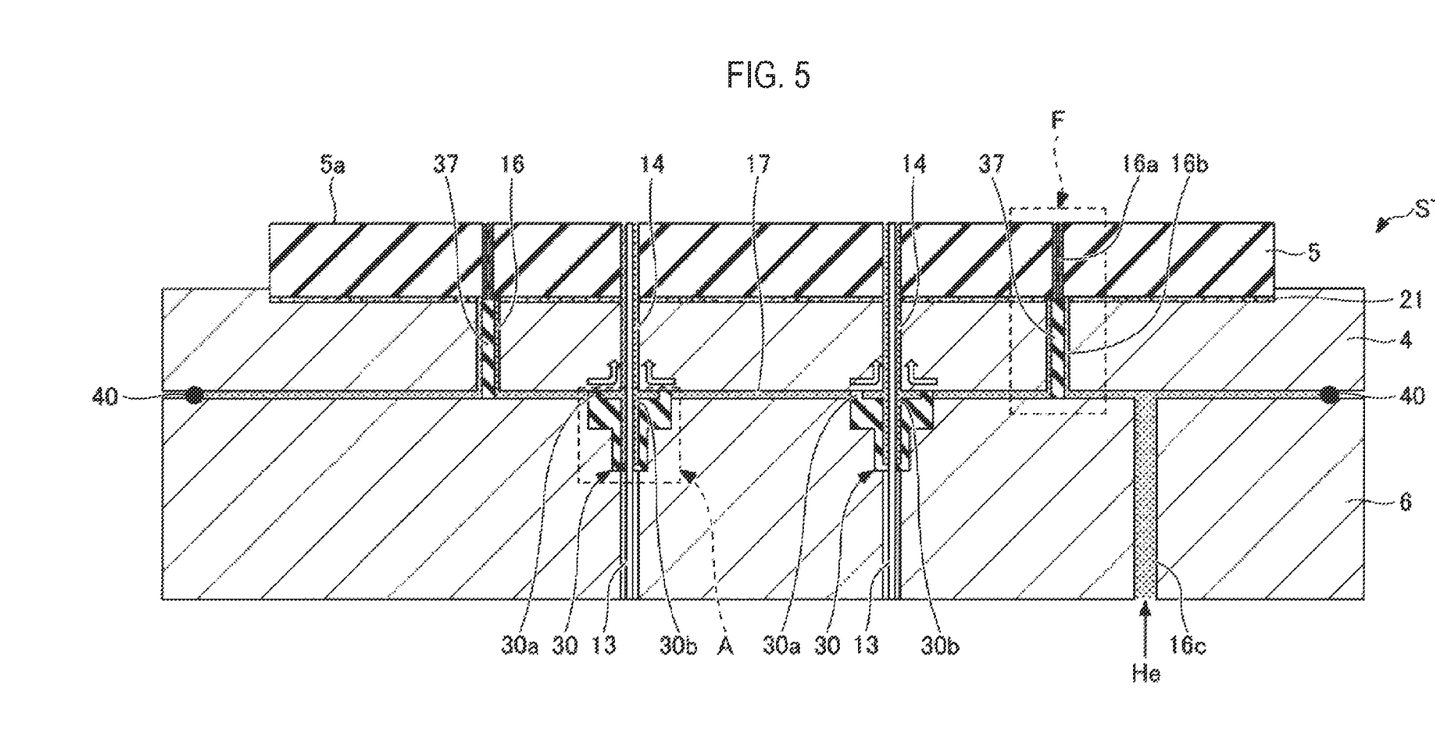
FIG. 5 is a cross-sectional view illustrating a stage according to a modification of the embodiment.
Figure 6A:
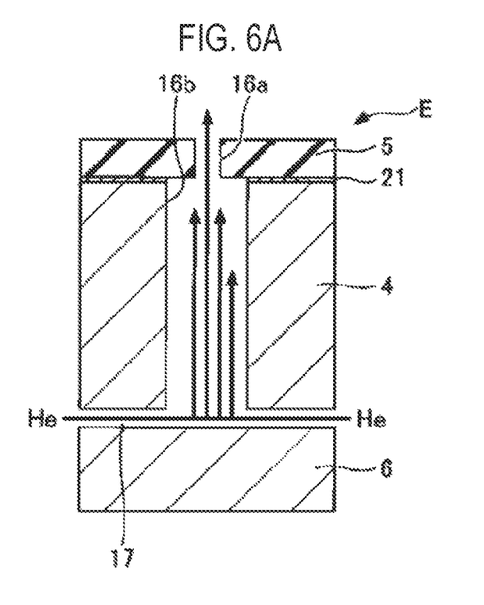
FIGS. 6A and 6B are enlarged views of a second member provided in the stage according to the modification of the embodiment.
Figure 6B:
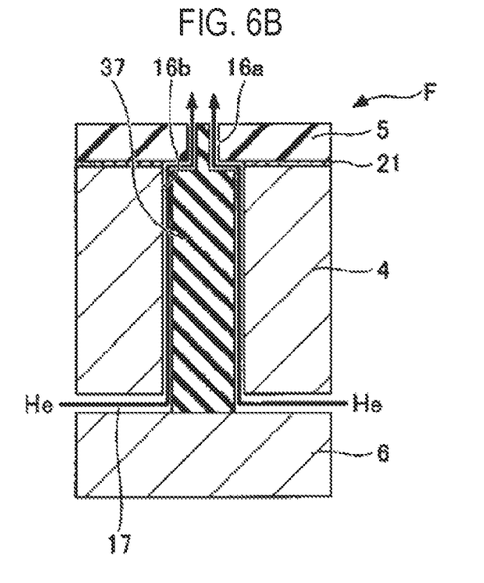

Next, a stage ST according to a modification of the embodiment will be described with reference to FIGS. 5 to 6B. FIG. 5 is a cross-sectional view illustrating the stage ST according to the modification of the embodiment. FIGS. 6A and 6B are enlarged views of a second member 37 provided in the stage ST according to the modification of the embodiment.

The stage ST according to the modification is different from the stage ST according to the embodiment in that the second member 37 is disposed inside the heat transfer gas passage 16 including the through-hole 16a at a leading end thereof. The rest of the configuration of the stage ST according to the modification is identical to that of the stage ST according to the embodiment, and therefore, the second member 37 will be described below and descriptions of other components will be omitted.

In the stage ST according to the modification, the flow rate of a helium gas introduced onto the mounting surface 5a of the electrostatic chuck 5 from the pin insertion passage 14 can be adjusted by the first member 30, while the flow rate of the helium gas introduced onto the mounting surface 5a from the heat transfer gas passage 16 can be adjusted by the second member 37.

In the example of FIG. 5, the second member 37 is inserted into the through-holes 16a and 16b of the heat transfer gas passage 16. The second member 37 may be formed of an insulating material such as resin, sapphire, PTFE, or the like.

Since the diameter of the through-hole 16b in FIG. 5 is larger than the diameter of the through-hole 16a, the diameter of a portion of the second member 37 corresponding to the through-hole 16b is larger than that of a portion of the second member 37 corresponding to the through-hole 16a. Thus, it is possible to prevent the second member 37 from jumping out from the inside of the heat transfer gas passage 16.

The upper end of the second member 37 is formed so as not to protrude from the mounting surface 5a of the electrostatic chuck 5. Further, the lower end of the second member 37 is in contact with the upper surface of the base 6. Accordingly, the flow rate of a gas in the heat transfer gas passage 16 can be adjusted by the second member 37. As a result, it is possible to optimize the flow rates of the helium gas flowing through the pin insertion passage 14 and the heat transfer gas passage 16, respectively.

For example, FIG. 6A illustrates an enlarged view of a frame E in FIG. 2, and FIG. 6B illustrates an enlarged view of a frame F in FIG. 5. When the second member 37 is inserted into the heat transfer gas passage 16 as illustrated in FIG. 6B, the conductance can be made lower than that of the case illustrated in FIG. 6A where the second member 37 is not inserted. Thus, it is possible to suppress the flow rate of the helium gas supplied onto the mounting surface 5a. Further, by changing the diameter of the second member 37, the conductance can be changed, which makes it possible to change the flow rate of the helium gas supplied onto the mounting surface 5a. The pin insertion passage 14 and the heat transfer gas passage 16 may be different in size. Therefore, the diameter and shape of the second member 37 may be changed according to the shape of the heat transfer gas passage 16. Also, whether or not to insert the second member 37 may be changed according to the shape of the heat transfer gas passage 16. Furthermore, the diameter of the lifter pin may be changed according to the shape of the pin insertion passage 14.

As described above, according to the stage ST of the modification, the helium gas can be supplied from the heat transfer gas passage 16 and the pin insertion passage 14. Thus, it is possible to prevent mainly the radicals in the plasma P from entering the pin insertion passage 14 and the heat transfer gas passage 16 to consume the bonding layer 21. Furthermore, the flow rate of the helium gas flowing through the pin insertion passage 14 can be adjusted by the first member 30, while the flow rate of the helium gas flowing through the heat transfer gas passage 16 can be adjusted by the second member 37. Thus, it is possible to suppress the flow rate of the helium gas flowing from the heat transfer gas passage 16 and the pin insertion passage 14 to the mounting surface 5a.

Moreover, in the embodiment and the modification, the introduction line of the helium gas supplied from the heat transfer gas source 19 is one line passing through the through-hole 16c, but the present disclosure is not limited thereto. For example, for the introduction line of the helium gas supplied to the heat transfer gas passage 16 and the pin insertion passage 14, the line of the through-hole 16c for allowing the helium gas to mainly flow through the heat transfer gas passage 16 and a line (not shown) for allowing the helium gas to mainly flow through the pin insertion passage 14 may be provided separately. Even in this case, the helium gas flowing through the heat transfer gas passage 16 and the pin insertion passage 14 can flow through the common gas passage 17.

[Heat Transfer Gas Supply Method]

Figure 7:
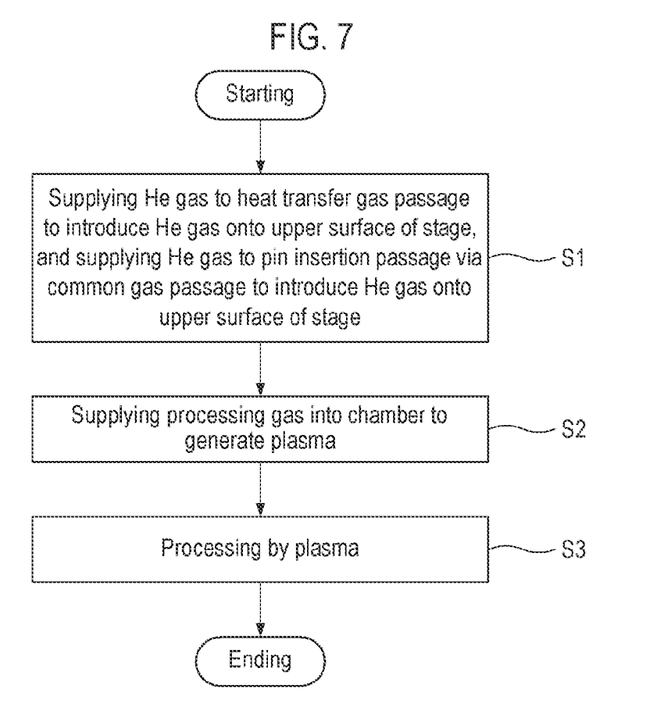
FIG. 7 is a flowchart illustrating a heat transfer gas supply method according to an embodiment.

Lastly, a heat transfer gas supply method executed in the substrate processing apparatus 100 having the stage ST according to the embodiment and the modification will be described with reference to FIG. 7. FIG. 7 is a flowchart illustrating the heat transfer gas supply method according to an embodiment. A process of the heat transfer gas supply method is controlled by the controller 90.

When the process of the heat transfer gas supply method starts, a helium gas is supplied from the heat transfer gas source 19 to the heat transfer gas passage 16 and is introduced into the upper surface of the stage ST (the mounting surface 5a of the electrostatic chuck 5) from the heat transfer gas passage 16 (step S). In addition, the helium gas is supplied to the pin insertion passage 14 via the common gas passage 17 and introduced into the upper surface of the stage ST from the pin insertion passage 14 (step S1). Subsequently, a processing gas is supplied into the chamber 1 to generate plasma from the processing gas by RF power (step S2). Subsequently, a desired process such as a cleaning process or the like is performed by the generated plasma (step S3), and the process is terminated.

According to the heat transfer gas supply method of the embodiment described above, the helium gas can be supplied from the heat transfer gas passage 16 and the pin insertion passage 14 to the upper surface of the stage ST. Accordingly, it is possible to prevent the plasma P or radicals from entering the pin insertion passage 14 and the heat transfer gas passage 16 to consume or deteriorate the bonding layer 21.

Although the stage, the substrate processing apparatus, and the heat transfer gas supply method have been described above with the aforementioned embodiments, the stage, the substrate processing apparatus, and the heat transfer gas supply method according to the present disclosure are not limited to the aforementioned embodiments but various modifications and improvements can be made within the scope of the present disclosure. The matters described in the embodiments and the modifications described above may be combined within a non-contradictory range.

For example, although the stage according to the embodiment and the modifications described above has the electrostatic chuck, the stage is not limited thereto but may be, for example, a stage having no electrostatic chuck.

The substrate processing apparatus according to the present disclosure may be applied to any type of capacitively coupled plasma (CCP), inductively coupled plasma (ICP), radial line slot antenna, electron cyclotron resonance plasma (ECR), and helicon wave plasma (HWP). Therefore, the substrate processing apparatus according to the present disclosure may be applied to an apparatus including a chamber having a plasma processing space, a stage disposed in the processing space, and a plasma generator configured to form plasma from a gas supplied to the processing space.

According to the present disclosure in some embodiments, it is possible to prevent deterioration of a bonding agent used for bonding of a stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage, comprising:
   a base disposed within a chamber and formed of a conductive material;
   an electrode disposed above the base; and
   an electrostatic chuck disposed above the electrode;
   wherein a first pin insertion passage, which penetrates from an upper surface of the electrostatic chuck to a lower surface of the electrostatic chuck and allows a lifter pin to be inserted into and penetrate the first pin insertion passage, is formed in the electrostatic chuck,
   wherein a first heat transfer gas passage, which penetrates the upper surface of the electrostatic chuck to the lower surface of the electrostatic chuck and is different from the first pin insertion passage, is formed in the electrostatic chuck, wherein a second pin insertion passage, which penetrates from an upper surface of the electrode to a lower surface of the electrode and is in communication with the first pin insertion passage, is formed in the electrode, wherein a second heat transfer gas passage, which penetrates from the upper surface of the electrode to the lower surface of the electrode and is in communication with the first heat transfer gas passage, is formed in the electrode, wherein a third pin insertion passage, which penetrates from an upper surface of the base to a lower surface of the base and is in communication with the second pin insertion passage, is formed in the base, wherein the second pin insertion passage is in communication with the second heat transfer gas passage through a common gas passage formed between the lower surface of the electrode and the upper surface of the base, wherein the first pin insertion passage is vertically in communication with the second pin insertion passage with respect to the upper surface of the electrostatic chuck, wherein a recess in communication with the second pin insertion passage is formed on the upper surface of the base, wherein a first member, which includes a plurality of protrusions formed circumferentially, is disposed on the recess, and wherein the second pin insertion passage is in communication with the common gas passage through grooves formed between the protrusions.

2. The stage of claim 1, wherein a second member configured to adjust a flow rate of a heat transfer gas is disposed inside the second heat transfer gas passage.

3. The stage of claim 1, wherein the grooves are formed radially.

4. The stage of claim 2, wherein the grooves are formed radially.

5. The stage of claim 1, wherein a third heat transfer gas passage, which penetrates from the upper surface of the base to the lower surface of the base and is in communication with the second heat transfer gas passage, is formed in the base.

6. The stage of claim 2, wherein a third heat transfer gas passage, which penetrates from the upper surface of the base to the lower surface of the base and is in communication with the second heat transfer gas passage, is formed in the base.

7. The stage of claim 1, wherein a diameter of the first pin insertion passage is equal to a diameter of the second pin insertion passage.

8. The stage of claim 2, wherein a diameter of the first pin insertion passage is equal to a diameter of the second pin insertion passage.

9. The stage of claim 1, wherein the first heat transfer gas passage is vertically in communication with the second heat transfer gas passage with respect to the upper surface of the electrostatic chuck, and wherein a diameter of the second heat transfer gas passage is larger than a diameter of the first heat transfer gas passage.

10. The stage of claim 2, wherein the first heat transfer gas passage is vertically in communication with the second heat transfer gas passage with respect to the upper surface of the electrostatic chuck, and wherein a diameter of the second heat transfer gas passage is larger than a diameter of the first heat transfer gas passage.

11. A substrate processing apparatus, comprising:
a chamber;
a base disposed within the chamber and formed of a conductive material;
an electrode disposed above the base; and
an electrostatic chuck disposed above the electrode;
wherein a first pin insertion passage, which penetrates from an upper surface of the electrostatic chuck to a lower surface of the electrostatic chuck and allows a lifter pin to be inserted into and penetrate the first pin insertion passage, is formed in the electrostatic chuck, wherein a first heat transfer gas passage, which penetrates the upper surface of the electrostatic chuck to the lower surface of the electrostatic chuck and is different from the first pin insertion passage, is formed in the electrostatic chuck, wherein a second pin insertion passage, which penetrates from an upper surface of the electrode to a lower surface of the electrode and is in communication with the first pin insertion passage, is formed in the electrode, wherein a second heat transfer gas passage, which penetrates from the upper surface of the electrode to the lower surface of the electrode and is in communication with the first heat transfer gas passage, is formed in the electrode, wherein a third pin insertion passage, which penetrates from an upper surface of the base to a lower surface of the base and is in communication with the second pin insertion passage, is formed in the base, wherein the second pin insertion passage is in communication with the second heat transfer gas passage through a common gas passage formed between the lower surface of the electrode and the upper surface of the base, wherein the first pin insertion passage is vertically in communication with the second pin insertion passage with respect to the upper surface of the electrostatic chuck, wherein a recess in communication with the second pin insertion passage is formed on the upper surface of the base, wherein a first member, which includes a plurality of protrusions formed circumferentially, is disposed on the recess, and wherein the second pin insertion passage is in communication with the common gas passage through grooves formed between the protrusions.

12. The substrate processing apparatus of claim 11, wherein a second member configured to adjust a flow rate of a heat transfer gas is disposed inside the second heat transfer gas passage.

13. The substrate processing apparatus of claim 11, wherein the grooves are formed radially.

14. The substrate processing apparatus of claim 12, wherein the grooves are formed radially.

15. The substrate processing apparatus of claim 11, wherein a third heat transfer gas passage, which penetrates from the upper surface of the base to the lower surface of the base and is in communication with the second heat transfer gas passage, is formed in the base.

16. The substrate processing apparatus of claim 12, wherein a third heat transfer gas passage, which penetrates from the upper surface of the base to the lower surface of the base and is in communication with the second heat transfer gas passage, is formed in the base.

17. The substrate processing apparatus of claim 11, wherein a diameter of the first pin insertion passage is equal to a diameter of the second pin insertion passage.

18. The substrate processing apparatus of claim 12, wherein a diameter of the first pin insertion passage is equal to a diameter of the second pin insertion passage.

19. The substrate processing apparatus of claim 11, wherein the first heat transfer gas passage is vertically in communication with the second heat transfer gas passage with respect to the upper surface of the electrostatic chuck, and wherein a diameter of the second heat transfer gas passage is larger than a diameter of the first heat transfer gas passage.

20. The substrate processing apparatus of claim 12, wherein the first heat transfer gas passage is vertically in communication with the second heat transfer gas passage with respect to the upper surface of the electrostatic chuck, and wherein a diameter of the second heat transfer gas passage is larger than a diameter of the first heat transfer gas passage.

* * * * *